US012512299B2

(12) United States Patent
Maier et al.

(10) Patent No.: US 12,512,299 B2
(45) Date of Patent: Dec. 30, 2025

(54) POWER SUPPLY DEVICE AND PLASMA SYSTEM

(71) Applicant: TRUMPF Huettinger GmbH + Co. KG, Freiburg (DE)

(72) Inventors: Florian Maier, Pfaffenweiler (DE); Thomas Sprenger-Lorenz, Freiburg (DE)

(73) Assignee: TRUMPF HUETTINGER GMBH + CO. KG, Freiburg (DE)

( * ) Notice: Subject to any disclaimer, the term of this patent is extended or adjusted under 35 U.S.C. 154(b) by 278 days.

(21) Appl. No.: 18/448,184

(22) Filed: Aug. 11, 2023

(65) Prior Publication Data

US 2024/0006155 A1 Jan. 4, 2024

Related U.S. Application Data

(63) Continuation of application No. PCT/EP2022/053242, filed on Feb. 10, 2022.

(30) Foreign Application Priority Data

Feb. 12, 2021 (DE) .................... 20 2021 100 710.9

(51) Int. Cl.
*H01J 37/32* (2006.01)

(52) U.S. Cl.
CPC .............................. *H01J 37/32183* (2013.01)

(58) Field of Classification Search
None
See application file for complete search history.

(56) References Cited

U.S. PATENT DOCUMENTS

| | | | | | |
|---|---|---|---|---|---|
| 4,849,675 | A * | 7/1989 | Muller | H01J 27/16 | 315/111.81 |
| 5,543,689 | A * | 8/1996 | Ohta | H01J 37/3299 | 315/111.41 |
| 6,024,044 | A * | 2/2000 | Law | H01J 37/32165 | 315/111.21 |
| 2001/0021422 | A1* | 9/2001 | Yamakoshi | H01J 37/32082 | 315/169.3 |
| 2003/0184319 | A1* | 10/2003 | Nishimori | H03H 11/30 | 324/684 |
| 2004/0227055 | A1* | 11/2004 | Hausberger | G11B 7/00375 | 369/44.11 |
| 2008/0218264 | A1* | 9/2008 | Kirchmeier | H01L 25/16 | 330/251 |

(Continued)

FOREIGN PATENT DOCUMENTS

| | | | |
|---|---|---|---|
| DE | 102015220847 | A1 | 4/2017 |
| DE | 202020103539 | U1 | 6/2020 |

(Continued)

*Primary Examiner* — Srinivas Sathiraju
(74) *Attorney, Agent, or Firm* — LEYDIG, VOIT & MAYER, LTD.

(57) ABSTRACT

A power supply device for generating an electrical high frequency (HF) power signal for a plasma includes a power generator and an impedance matching arrangement connected to the power generator. The power supply device is configured to determine an impedance variable at an input of the impedance matching arrangement or at an output of the power generator, determine an impedance-based quality index in a predefined time period, and output the impedance-based quality index.

20 Claims, 1 Drawing Sheet

(56) References Cited

U.S. PATENT DOCUMENTS

| | | | | |
|---|---|---|---|---|
| 2010/0171428 | A1* | 7/2010 | Kirchmeier | H01J 37/32045 315/111.21 |
| 2011/0005679 | A1* | 1/2011 | Hanawa | H01J 37/32174 156/345.24 |
| 2013/0210241 | A1* | 8/2013 | LaVoie | H01L 21/02211 257/E21.24 |
| 2015/0287576 | A1* | 10/2015 | Grede | H01J 37/32064 315/111.21 |
| 2018/0247795 | A1 | 8/2018 | Maier et al. | |
| 2019/0209776 | A1* | 7/2019 | Fleischer | A61M 5/142 |
| 2020/0303166 | A1 | 9/2020 | Morii | |
| 2020/0411286 | A1* | 12/2020 | Koshimizu | H01J 37/32091 |
| 2021/0134563 | A1 | 5/2021 | Bock et al. | |
| 2023/0043171 | A1* | 2/2023 | Nordmann | H03F 3/19 |
| 2023/0072102 | A1* | 3/2023 | Hiraoka | H01J 37/32706 |
| 2023/0216467 | A1 | 7/2023 | Nordmann | |
| 2024/0006155 | A1* | 1/2024 | Maier | H01J 37/32183 |
| 2024/0006156 | A1* | 1/2024 | Maier | H01J 37/32174 |
| 2024/0105431 | A1* | 3/2024 | Maier | H01J 37/32926 |

FOREIGN PATENT DOCUMENTS

| | | | |
|---|---|---|---|
| JP | 2020156043 | A | 9/2020 |
| WO | WO 2020011668 | A1 | 1/2020 |

* cited by examiner

POWER SUPPLY DEVICE AND PLASMA SYSTEM

CROSS REFERENCE TO RELATED APPLICATIONS

This application is a continuation of International Application No. PCT/EP2022/053242 (WO 2022/171738 A1), filed on Feb. 10, 2022, and claims benefit to German Patent Application No. DE 20 2021 100 710.9, filed on Feb. 12, 2021. The aforementioned applications are hereby incorporated by reference herein.

FIELD

Embodiments of the present invention provide a power supply device for generating a high-frequency electric power signal for a plasma, and a plasma system comprising same. Embodiments of the present invention also provide a method for operating a power supply device.

BACKGROUND

Impedance matching networks are used to match the impedance of a load to the impedance of a power generator.

Impedance matching networks are commonly used in HF-excited plasma processes. The frequencies are typically 1 MHz or above. HF-excited plasma processes are used, for example, for coating, and/or sputtering, and/or etching substrates, in the manufacture of architectural glass, semiconductors, photovoltaic elements, flat panel screens, displays, etc. The impedances in such processes often change very rapidly, and therefore the impedance matching should often be adjusted very quickly e.g., within a few milliseconds or less. The electrical power typically supplied to such processes is in the region of a few 100 W, for example 300 W and greater, but it is not uncommon for the power to be a kilowatt or more, and often 10 kW or more. At such powers, the voltage within the impedance matching arrangements is often several 100 V, for example 300 V and greater, and not infrequently also 1000 V and greater. The currents in such circuits can be several amperes, often 10 A and more, sometimes also 100 A and more. Implementing impedance matching networks at such voltages and currents has always been a major challenge. The rapid changeability of reactances in such impedance matching networks is an additional, very great challenge. Examples of such impedance matching networks are disclosed, for example, in DE 10 2015 220 847 A1 or in DE 20 2020 103 539 U1.

Usually, impedance matching networks are used to transform the impedance of the load to 50 ohms. To obtain information about the quality of the impedance matching, the amount of the average reflected power is often determined and used as an indicator for the quality of the matching process. At the same time, the amount of mean reflected power serves as a stability criterion for the plasma. In pulsed applications, oscillation and decay processes occur at the beginning and end of each pulse, resulting in reflected power despite a stable plasma process and the best-possible matching.

SUMMARY

Embodiments of the present invention provide a power supply device for generating an electrical high frequency (HF) power signal for a plasma. The power supply device includes a power generator and an impedance matching arrangement connected to the power generator. The power supply device is configured to determine an impedance variable at an input of the impedance matching arrangement or at an output of the power generator, determine an impedance-based quality index in a predefined time period, and output the impedance-based quality index.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
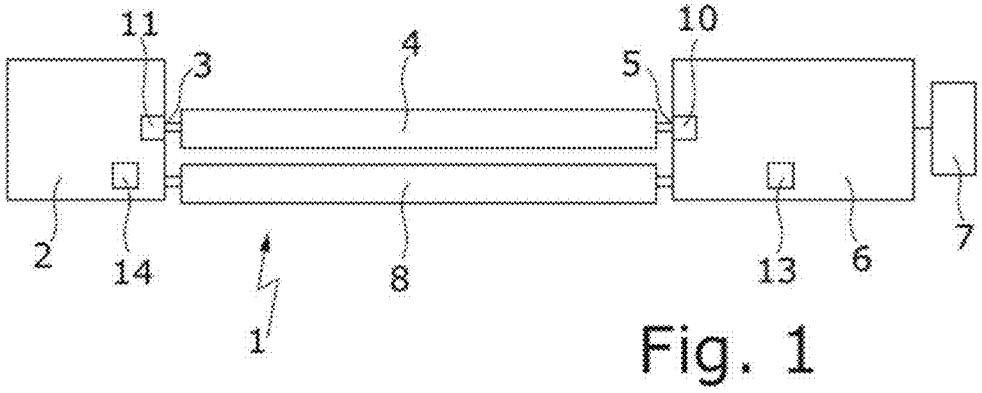
FIG. 1 shows a power supply device according to some embodiments.

Embodiments of the present invention provide a power supply device in which a more reliable conclusion can be drawn as to the quality of the matching process.

According to some embodiments, a power supply device for generating an electrical HF power signal for a plasma includes a power generator and an impedance matching arrangement connected to the power generator, wherein the power supply device is set up to determine an impedance variable, in particular at the input of the impedance matching arrangement or at the output of the power generator, to determine an impedance-based quality index in a predefined time period and, in particular, to output it for further processing and/or use.

An impedance variable can be a complex impedance, a complex reflection factor, magnitude and phase of an impedance or values derived therefrom, for example an admittance or a normalized impedance. In principle, it is conceivable to detect a complex or two-dimensional real variable as an impedance variable. In particular, if an integrated system is involved in which the impedance matching arrangement and power generator are combined, it is advantageous if the impedance variable is detected at the output of the power generator.

In contrast to an average reflected power, the impedance-based quality index is determined in a predefined time period. The predefined time period can be selected in such a way that oscillation and decay processes are not included in the determination of the impedance-based quality index. Thus, a meaningful quality index can be determined for the matching process. The impedance-based quality index can be a dimensionless variable.

The power supply device can be set up to determine an impedance mean value, in particular a geometric mean value, a geometric center of gravity, arithmetic mean value or median of the measured impedance variables as an impedance-based quality index. In particular, a geometric mean value can be determined in a particularly simple manner.

The power supply device may be set up to generate a manipulated variable of the impedance matching arrangement such that the quality index assumes a predefined value. The impedance matching arrangement can thus perform impedance matching on the basis of the quality index. For example, a manipulated variable can be used to adjust a changeable reactance of the impedance matching arrangement so that impedance matching is performed.

If the impedance matching arrangement is not adjustable, it is conceivable to vary the power output by the power generator on the basis of the determined quality index in order to achieve a better quality index and thus better impedance matching. For example, the frequency of the HF power signal can be changed.

The power supply device can be set up to determine an evaluated reflected power on the basis of the quality index. An evaluated reflected power is a variable that a user can assess and classify because they are used to it. The determined evaluated reflected power, in the following also called virtual reflected power, does not correspond to the actual measurable reflected power. The determined evaluated reflected power can likewise be understood as a quality index.

The impedance matching arrangement can have a measuring device that is set up to determine the quality index. Thus, a direct determination of the quality index can be performed.

Alternatively, it is conceivable that the impedance matching arrangement comprises a controller that is set up to determine the quality index. In particular, an integration part of a controller can implicitly average the detected impedance variable over a time period. The controller is used here to adjust or control the quality index to a setpoint value as far as possible.

The quality index can be output to the power generator. It is thereby possible for the generator to use a sensed forward power to determine the evaluated virtual reflected power. In particular, if a control algorithm for the matching does not convert, this will result in a high reflected power. Usually, therefore, the reflected power serves as a measure of whether the control or matching was successful. However, this is not true for transient impedances, especially at high pulse frequencies. Reflected power also occurs when the control algorithm has achieved the best-possible match. According to embodiments of the invention, the quality index, in particular a geometric mean value of the impedance variable, is used to calculate an evaluated virtual reflected power. This can be displayed instead of or in addition to the actual reflected power, thus providing a familiar and known variable for the user.

The quality index can be output as an analog signal, for example. However, it is particularly advantageous if a display device is provided for outputting the determined evaluated reflected power.

The power generator may be set up to measure a generated forward power. This measured generated power can be used to determine the evaluated virtual reflected power.

The predefined time period can be determined such that maximum energy transfer into the plasma occurs without affecting the determined evaluated virtual reflected power. In particular, the time period can be shorter than the pulse duration. Furthermore, the time period can be chosen such that the pulse start is outside the time period.

Embodiments of the invention also provide a method for operating a power supply device to generate a high-frequency (HF) electrical power signal for a plasma, wherein an impedance variable is determined, in particular at the input of an impedance matching arrangement or at the output of a power generator, an impedance-based quality index is determined in a predefined time period, and the impedance-based quality index is output. In particular, the impedance-based quality index may be output for further use or processing. The impedance-based quality index can be output as a digital or analog signal.

As an impedance-based quality index, an impedance mean value, in particular a geometric mean value, a geometric center of gravity, an arithmetic mean value or median of the measured impedance variables can be determined.

A manipulated variable for the impedance matching arrangement can be generated so that the quality index assumes a predefined value.

Based on the quality index, an evaluated virtual reflected power can be determined. The evaluated virtual reflected power is a power calculated on the basis of the quality index as opposed to a measured actual reflected power.

The quality index can be determined directly in the measuring device or indirectly by a controller of the impedance matching arrangement.

The quality index can be output to the power generator. Based on the quality index, the virtual reflected power can be determined in the power generator. The evaluated reflected power can be output to a display device.

The predefined time period can be determined such that maximum energy transfer into the plasma occurs without affecting the determined evaluated virtual reflected power.

Embodiments of the invention also provide a plasma system comprising a power supply device as described above and a plasma process device, in particular an HF-excited plasma process device, i.e., a device for performing plasma processes. The plasma device is preferably used for coating, and/or sputtering, and/or etching substrates. It is preferably suitable for use in the manufacture of architectural glass, semiconductors, photovoltaic elements, flat screens or displays.

The high frequency of the high-frequency power signal can be 1 MHz or above.

The electrical power required to supply the plasma process, and which the power supply device is designed to deliver, can be 300 W and greater, in particular 1 kilowatt and more.

The plasma process device can be designed to connect additional power supplies, of which one or more of the following may be used, for example:

HF power supply with the same or other high frequency
DC power supply, especially pulsed DC power supply
MF Power supply with frequencies below 1 MHz.

FIG. 1 shows a power supply device 1 with a power generator 2 for generating an electrical HF power signal, for example at 60 MHz which is, in particular, a pulsed HF power signal. The power generator 2 has an output 3 which is connected via an HF cable 4 to an input 5 of an impedance matching arrangement 6. The impedance matching arrangement 6 is connected to a load 7. The power generator 2 and the impedance matching arrangement 6 are furthermore connected to each other via a signal connection 8. The load 7 may be a plasma of a plasma process, in particular an HF-excited plasma process, for example for coating, and/or sputtering, and/or etching substrates, in the manufacturing of architectural glass, semiconductors, photovoltaic elements, flat panel screens, and displays.

The impedance matching arrangement 6 is used to match the impedance of the load 7 to the impedance of the power generator 2 at the input 3. The power generator 2 may be set up to supply the pulsed HF power to the load 7. Since the impedance of the load 7, especially if it is a plasma, may change frequently and rapidly, there are special requirements for the impedance matching arrangement 6 to match the impedance of the load 7 to the impedance of the power generator 2.

A measuring device 10 can be provided in the region of the input 5 of the impedance matching arrangement 6 in order to detect an impedance variable. Alternatively or additionally, a measuring device 11 can be provided in the region of the output 3 of the power generator 2 in order to detect an impedance variable. The impedance variable may be a complex impedance, complex reflection factor, magnitude and phase of the impedance, etc. Based on this detected impedance quantity, an impedance-based quality index can be determined in a predefined time period, which provides an indication of how good the impedance matching is.

This will be explained with reference to FIG. 2.

Figures 2A, 2B, 2C, 2D:
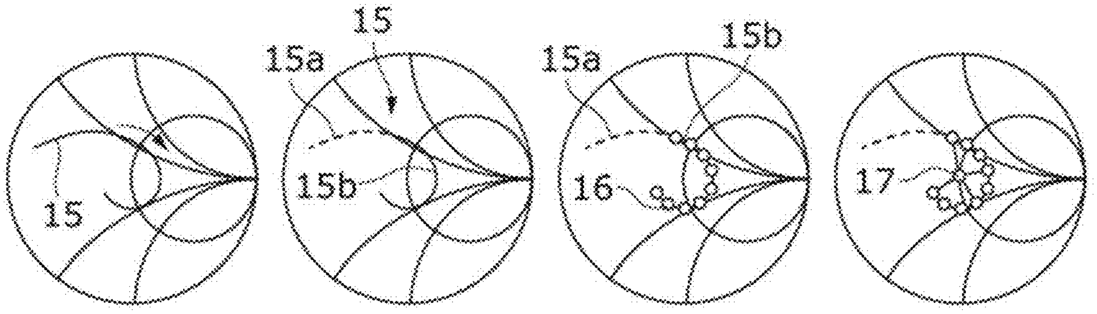
FIG. 2A, FIG. 2B, FIG. 2C and FIG. 2D show the procedure for determining a quality index on the basis of admittance levels according to some embodiments.

FIG. 2*a* shows the trajectory 15 of the impedance of the load 7 during a high-frequency pulse of the power generator 2. It can be seen that the impedance of the load 7 changes considerably during the pulse. A 'trajectory' is in other words the 'course over time'.

FIG. 2*b* shows that the first portion 15*a*, which corresponds to the start of the pulse, is not taken into account when determining the quality index, i.e., it is blanked out, so to speak. Only the second portion 15*b* of the trajectory 15 is taken into account.

In FIG. 2*c*, it can be seen that discrete impedance points 16, i.e., the impedance magnitude at different points in time, lying on the second portion 15*b* of the trajectory 15, are measured by one of the measuring devices 10, 11.

In FIG. 2*d*, it can be seen that a geometric center of gravity is determined as an impedance-based quality index 17.

A controller 13 of the impedance matching arrangement 6 can be supplied with a manipulated variable such that the quality index 17 is minimized, and thus better matching is achieved.

Furthermore, the quality index 17 can be used to calculate an evaluated (virtual) reflected power. For this purpose, the quality index can be output to the power generator 2 via the signal connection 8, for example, so that an evaluated (virtual) reflected power can be determined there by the determination device 14.

Figure 3:
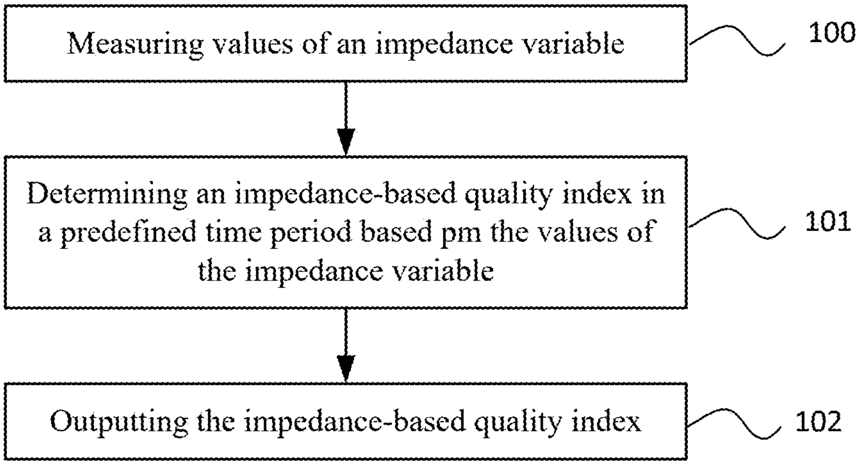
FIG. 3 shows a flow chart for a method for determining a quality index according to some embodiments.

FIG. 3 shows a flow chart of a method according to embodiments of the invention. In step 100, impedance variables are measured. In step 101, an impedance-based quality index is determined from the impedance variable measured over a predefined time period. In step 102, the impedance-based quality index is output so that it can be further processed.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A power supply device for generating an electrical high frequency (HF) power signal for a plasma, the power supply device comprising:

a power generator, and an impedance matching arrangement connected to the power generator, a measuring device configured to measure a plurality of values of an impedance variable during a high-frequency pulse generated by the power generator at an input of the impedance matching arrangement or at an output of the power generator, and a controller configured to:

determine an impedance-based quality index in a predefined time period of the high-frequency pulse based on a subset of the plurality of values of the impedance variable within the predefined time period, wherein the impedance-based quality index is one of a geometric mean value of the impedance variable, a geometric center of gravity of the impedance variable, an arithmetic mean value of the impedance variable, or a median value of the impedance variable, and output the impedance-based quality index.

2. The power supply device as claimed in claim 1, wherein the controller is configured to generate a manipulated variable of the impedance matching arrangement such that the quality index assumes a predefined value.

3. The power supply device as claimed in claim 1, wherein the controller is configured to determine an evaluated reflected power based on the quality index.

4. The power supply device as claimed in claim 1, wherein the measuring device is at the impedance matching arrangement or the power generator.

5. The power supply device as claimed in claim 1, wherein the controller is at the impedance matching arrangement.

6. The power supply device as claimed in claim 1, wherein the quality index is output to the power generator.

7. The power supply device as claimed in claim 3, further comprising a display device for outputting the evaluated reflected power.

8. The power supply device as claimed in claim 1, wherein the power generator is configured to measure a generated power.

9. The power supply device as claimed in claim 3, wherein the predefined time period is determined such that a maximum energy transfer into the plasma occurs without affecting the evaluated reflected power.

10. The power supply device as claimed in claim 1, wherein a voltage within the impedance matching arrangement during operation is 300 V or greater.

11. The power supply device as claimed in claim 1, wherein a current within the impedance matching arrangement during operation is 10 A or greater.

12. A plasma system comprising:

the power supply device as claimed in claim 1, and a plasma process device coupled to the power supply device, the plasma process device configured for coating, and/or sputtering, and/or etching substrates, for use in manufacturing of architectural glass, semiconductors, photovoltaic elements, flat panel screens, or displays.

13. A method for operating a power supply device for generating a high-frequency electrical power signal for a plasma, the method comprising:

measuring a plurality of values of an impedance variable during a high-frequency pulse generated by a power generator of the power supply device, at an input of an impedance matching arrangement of the power supply device, or at an output of the power generator of the power supply device, determining an impedance-based quality index in a predefined time period of the high-frequency pulse based on a subset of the plurality of values of the impedance variable within the predefined time period, wherein the impedance-based quality index is one of a geometric mean value of the impedance variable, a geometric center of gravity of the impedance variable, an arithmetic mean value of the impedance variable, or a median value of the impedance variable, and outputting the impedance-based quality index.

14. The method as claimed in claim 13, further comprising generating a manipulated variable for the impedance matching arrangement such that the quality index assumes a predefined value.

15. The method as claimed in claim 13, further comprising determining an evaluated reflected power based on the quality index.

16. The method as claimed in claim 13, wherein the quality index is determined directly in a measuring device of the power generator, or indirectly by a controller of the impedance matching arrangement.

17. The method as claimed in claim 13, wherein the quality index is output to the power generator.

18. The method as claimed in claim 15, wherein the predefined time period is determined such that a maximum energy transfer into the plasma occurs without affecting the evaluated reflected power.

19. The method as claimed in claim 13, wherein the impedance matching arrangement is operated at a voltage of 300 V or greater.

20. The method as claimed in claim 13, wherein the impedance matching arrangement is operated at a current of 10 A or greater.

* * * * *